US012615954B2

(12) United States Patent
Cai et al.

(10) Patent No.: US 12,615,954 B2
(45) Date of Patent: Apr. 28, 2026

(54) DISPLAY APPARATUSES, DISPLAY SUBSTRATES, AND METHODS OF PREPARING DISPLAY SUBSTRATES

(71) Applicants: Chengdu BOE Optoelectronics Technology Co., Ltd., Sichuan (CN); BOE Technology Group Co., Ltd., Beijing (CN)

(72) Inventors: Jianchang Cai, Beijing (CN); Yao Huang, Beijing (CN); Yue Long, Beijing (CN); Yuxin Zhang, Beijing (CN); Yuejiao Qin, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 542 days.

(21) Appl. No.: 17/789,070

(22) PCT Filed: Apr. 29, 2021

(86) PCT No.: PCT/CN2021/091181
§ 371 (c)(1),
(2) Date: Jun. 24, 2022

(87) PCT Pub. No.: WO2022/226941
PCT Pub. Date: Nov. 3, 2022

(65) Prior Publication Data
US 2024/0178355 A1     May 30, 2024

(51) Int. Cl.
*H10K 77/10*        (2023.01)
*H01L 25/075*       (2006.01)
(Continued)

(52) U.S. Cl.
CPC ......... *H10K 77/10* (2023.02); *H01L 25/0753* (2013.01); *H10H 20/853* (2025.01);
(Continued)

(58) Field of Classification Search
CPC ..... H01L 33/62; H01L 25/0753; H01L 33/54; H01L 2933/005; H01L 25/167
See application file for complete search history.

(56) References Cited

U.S. PATENT DOCUMENTS

2006/0243980 A1    11/2006  Lee et al.
2015/0001500 A1*    1/2015  Sung .................. H10K 59/8722
257/40
(Continued)

FOREIGN PATENT DOCUMENTS

CN        104900656 A       9/2015
CN        110165071 A       8/2019
(Continued)

OTHER PUBLICATIONS

PCT/CN2021/091181 international search report.
PCT/CN2021/091181 Written Opinion.

*Primary Examiner* — Jay C Kim
*Assistant Examiner* — Woo K Lee
(74) *Attorney, Agent, or Firm* — IPro, PLLC

(57) ABSTRACT

The present disclosure relates to the field of display technology, and provides a display apparatus, a display substrate, and a method of preparing a display substrate. The display substrate includes a display area and a frame area surrounding the display area, and further includes: a drive circuit layer provided on a base substrate; an insulating material structure provided on the drive circuit layer, located in the display area and at least a portion of the frame area, and provided with a step structure at an edge thereof; a light-emitting layer provided on the insulating material structure; an encapsulation layer covering the light-emitting layer; a
(Continued)

first barrier wall provided on the drive circuit layer, and surrounding the insulating material structure, where the edge is an edge of the insulating material structure close to the first barrier wall; and a conductive connection structure provided inside the insulating material structure and electrically connected with the drive circuit layer. The present disclosure can avoid circuit defects.

19 Claims, 3 Drawing Sheets

(51) Int. Cl.

| | |
|---|---|
| *H10H 20/01* | (2025.01) |
| *H10H 20/853* | (2025.01) |
| *H10H 20/857* | (2025.01) |
| *H10K 59/80* | (2023.01) |

(52) U.S. Cl.
CPC ....... *H10H 20/857* (2025.01); *H10H 20/0362* (2025.01); *H10H 20/0364* (2025.01); *H10K 59/873* (2023.02)

(56) References Cited

U.S. PATENT DOCUMENTS

| | | | |
|---|---|---|---|
| 2015/0084008 A1 | 3/2015 | Park et al. |
| 2016/0343736 A1 | 11/2016 | Liu et al. |
| 2019/0288234 A1 | 9/2019 | Kim et al. |
| 2020/0176550 A1* | 6/2020 | Youn | H10K 59/124 |
| 2020/0350301 A1 | 11/2020 | Zhai |
| 2020/0411629 A1 | 12/2020 | Kim et al. |
| 2021/0193769 A1* | 6/2021 | Bok | G06F 1/1605 |
| 2021/0376288 A1 | 12/2021 | Wang |
| 2022/0028963 A1 | 1/2022 | Lee et al. |
| 2022/0276735 A1 | 9/2022 | Pu et al. |

FOREIGN PATENT DOCUMENTS

| | | |
|---|---|---|
| CN | 110246879 A | 9/2019 |
| CN | 110277506 A | 9/2019 |
| CN | 110611047 A | 12/2019 |
| CN | 110634390 A | 12/2019 |
| CN | 111146215 A | 5/2020 |
| CN | 111162097 A | 5/2020 |
| CN | 111261670 A | 6/2020 |
| CN | 111477666 A | 7/2020 |
| CN | 211238254 U | 8/2020 |
| CN | 112133729 A | 12/2020 |
| CN | 112366220 A | 2/2021 |
| WO | 2020145449 A1 | 7/2020 |

* cited by examiner

DISPLAY APPARATUSES, DISPLAY SUBSTRATES, AND METHODS OF PREPARING DISPLAY SUBSTRATES

TECHNICAL FIELD

The present disclosure relates to the field of display technology, and in particular to a display apparatus, a display substrate, and a method of preparing a display substrate.

BACKGROUND

With the rapid development of society, display apparatuses have attracted more and more attention.

At present, with the popularization of full-screen displays, display apparatuses with under display cameras (UDCs) have gradually become mainstream. To improve a light transmittance of an area of a display substrate in the display apparatus corresponding to the UDC, only a light-emitting device is retained in this area, and a drive circuit for controlling the light-emitting device to emit light is provided outside a display area of the display substrate. However, the display apparatus is prone to circuit defects.

SUMMARY

An objective of the present disclosure is to provide a display apparatus, a display substrate, and a method of preparing a display substrate, which can avoid circuit defects.

According to an aspect of the present disclosure, there is provided a display substrate including a display area and a frame area surrounding the display area, including:

a base substrate;

a drive circuit layer provided on the base substrate;

an insulating material structure provided on a side of the drive circuit layer facing away from the base substrate, located in the display area and at least a portion of the frame area, and provided with a step structure at an edge thereof;

a light-emitting layer provided on a side of the insulating material structure facing away from the drive circuit layer;

an encapsulation layer covering the light-emitting layer;

a first barrier wall provided on the side of the drive circuit layer facing away from the base substrate, surrounding the insulating material structure, and configured to block a portion of the encapsulation layer, where the edge of the insulating material structure provided with the step structure is an edge of the insulating material structure close to the first barrier wall; and a conductive connection structure provided inside the insulating material structure and electrically connected with the drive circuit layer.

Further, the insulating material structure includes a plurality of planarization layers laminated on top of each other, and the conductive connection structure is wrapped between adjacent two of the planarization layers; and the plurality of planarization layers are staggered sequentially to form the step structure, and the step structure has a step height that gradually increases in a direction from the edge of the insulating material structure to the display area.

Further, the display substrate also includes:

one or more light-transmitting wires provided between at least portions of adjacent two of the planarization layers and electrically connected with the light-emitting layer.

Further, the display area includes a first display area and a second display area; the light-emitting layer includes at least one first light-emitting structure located in the first display area and at least one second light-emitting structure located in the second display area, and the drive circuit layer includes a first drive circuit and a second drive circuit; at least a portion of the second drive circuit and at least a portion of the conductive connection structure are located outside the second display area, and the portion of the second drive circuit located outside the second display area is electrically connected with the portion of the conductive connection structure located outside the second display area; and one end of the light-transmitting wire is electrically connected with the portion of the conductive connection structure located outside the second display area, and the other end of the light-transmitting wire is electrically connected with the second light-emitting structure.

Further, the plurality of planarization layers include a first planarization layer, a second planarization layer, a third planarization layer, a fourth planarization layer, and a fifth planarization layer that are laminated sequentially in a direction away from the base substrate; and the conductive connection structure is wrapped between the first planarization layer and the second planarization layer; and the light-transmitting wires include: a first light-transmitting wire disposed between the second planarization layer and the third planarization layer; a second light-transmitting wire disposed between the third planarization layer and the fourth planarization layer; and a third light-transmitting wire disposed between the fourth planarization layer and the fifth planarization layer, and the first light-transmitting wire, the second light-transmitting wire, and the third light-transmitting wire are electrically connected with second light-emitting structures with sub-pixels of different colors, respectively.

Further, the frame area includes a bonding area located on a side of the insulating material structure in a direction parallel to the base substrate; the step structure is disposed at the edge of the insulating material structure close to the bonding area; the frame area is provided with a power signal line in an area located between the bonding area and the display area, and the power signal line includes a first portion extending substantially in a first direction and a second portion extending substantially in a second direction, where the first direction is an extension direction of a side edge of the display area close to the bonding area, and the second direction is substantially perpendicular to the first direction; the first direction is electrically connected with the drive circuit layer, and a first end of the second portion is connected with the first portion; and the conductive connection structure includes the first portion.

Further, an orthographic projection of an edge of the first portion of the power signal line close to the bonding area on the base substrate is located within an orthographic projection of the step structure on the base substrate.

Further, an orthographic projection of an edge of the first portion of the power signal line close to the bonding area on the base substrate is located within an orthographic projection of the second planarization layer on the base substrate.

Further, the first barrier wall includes a plurality of first barrier layers laminated on top of each other, and a part of the plurality of first barrier layers are arranged in same layers as a part of the plurality of planarization layers, respectively.

Further, the display substrate also includes:

a pixel definition layer provided on the side of the insulating material structure facing away from the drive circuit layer, and the encapsulation layer covering the pixel definition layer, where one of the plurality of first barrier layers farthest from the base substrate is arranged in a same layer as the pixel definition layer.

Further, the display substrate also includes:

a second barrier wall provided on the side of the drive circuit layer facing away from the base substrate, and surrounding the first barrier wall, where the second barrier wall includes a plurality of second barrier layers laminated on top of each other, and a part of the plurality of second barrier layers are arranged in same layers as a part of the plurality of first barrier layers, respectively.

Further, at least a part of the plurality of first barrier layers of the first barrier wall are structurally integrated with at least a part of the plurality of second barrier layers of the second barrier wall.

Further, the display substrate also includes:

a pixel definition layer provided on the side of the insulating material structure facing away from the drive circuit layer, and covering the step structure.

Further, the plurality of planarization layers have at least partially different staggered distances between two adjacent ones thereof.

According to an aspect of the present disclosure, there is provided a display apparatus, including the display substrate as described above.

According to an aspect of the present disclosure, there is provided a display apparatus, including:

the display substrate as described above; and a photosensitive device provided on a side of the base substrate facing away from the drive circuit layer and overlapping with the second display area.

According to an aspect of the present disclosure, there is provided a method of preparing a display substrate, including:

providing a base substrate;

forming a drive circuit layer on the base substrate;

forming an insulating material structure and a conductive connection structure on a side of the drive circuit layer facing away from the base substrate, the insulating material structure being provided with a step structure at an edge thereof, and located in the display area and at least a portion of the frame area, and the conductive connection structure being provided inside the insulating material structure and electrically connected with the drive circuit layer;

forming a light-emitting layer on a side of the insulating material structure facing away from the drive circuit layer, the light-emitting layer being electrically connected with the conductive connection structure;

forming an encapsulation layer to cover the light-emitting layer; and forming a first barrier wall on the side of the drive circuit layer facing away from the base substrate, the first barrier wall surrounding the insulating material structure, and being configured to block a portion of the encapsulation layer, where the edge of the insulating material structure provided with the step structure is an edge of the insulating material structure close to the first barrier wall.

Further, the insulating material structure includes a plurality of planarization layers laminated on top of each other, and forming the insulating material structure and the conductive connection structure on the side of the drive circuit layer facing away from the base substrate, includes:

forming a first planarization layer on the side of the drive circuit layer facing away from the base substrate;

forming the conductive connection structure on a side of the first planarization layer facing away from the base substrate; and forming the rest of the plurality of planarization layers on the side of the first planarization layer facing away from the base substrate, where the conductive connection structure is wrapped between the first planarization layer and the planarization layer adjacent to the first planarization layer, the plurality of planarization layers are staggered sequentially to form the step structure, and the step structure has a step height that gradually increases in a direction from the edge of the insulating material structure to the display area.

With a display apparatus, a display substrate, and a method of preparing a display substrate according to embodiments of the present disclosure, an insulating material structure is provided with a step structure at an edge thereof to provide a slope at the edge of the insulating material structure, which can reduce the risk of fracture of a subsequent film layer covering the edge of the insulating material structure. Meanwhile, since a conductive connection structure is provided inside the insulating material structure, it is possible to prevent corrosion of the conductive connection structure by an etchant used in a subsequent film layer forming process, and avoid warping of the conductive connection structure, which can prevent the conductive connection structure from being electrically connected with both electrodes of a light-emitting layer to cause circuit defects.

DESCRIPTION OF REFERENCE SIGNS

Figure 1:
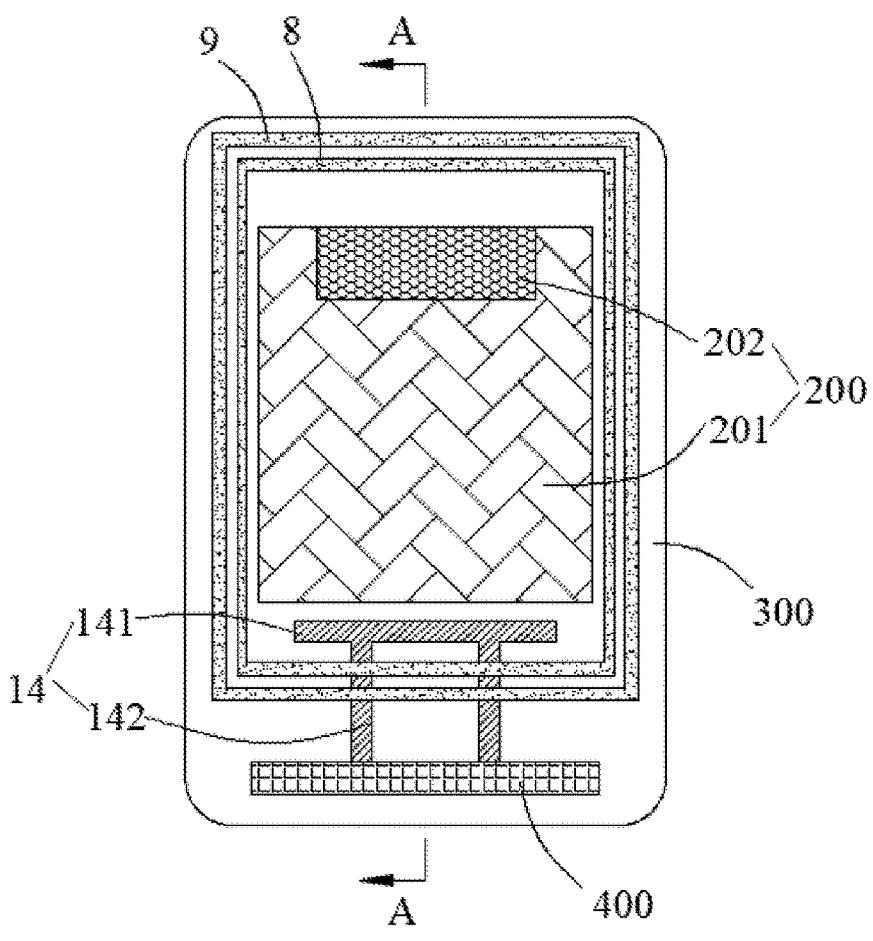
FIG. 1 is a schematic plan view illustrating a display substrate according to an embodiment of the present disclosure.

1: base substrate; 2: drive circuit layer; 21: active layer; 22: gate insulation layer; 23: gate electrode; 24: interlayer insulation layer; 25: source electrode; 26: drain electrode; 3: planarization layer; 31: first planarization layer; 32: second planarization layer; 33: third planarization layer; 34: fourth planarization layer; 35: fifth planarization layer; 4: conductive connection structure; 5: light-transmitting wire; 51: first light-transmitting wire; 52: second light-transmitting wire; 53: third light-transmitting wire; 6: light-emitting layer; 61: first electrode; 62: luminescent material layer; 63: second electrode; 7: pixel definition layer; 8: first barrier wall; 81: first barrier layer; 9: second barrier wall; 91: second barrier layer; 10: encapsulation layer; 11: first inorganic layer; 12:

organic layer; 13: second inorganic layer; 14: power signal line; 141: first portion; 142: second portion; 100: insulating material structure; 101: step structure; 200: display area; 201: first display area; 202: second display area; 300: frame area; 400: bonding area.

DETAILED DESCRIPTION OF THE EMBODIMENTS

Exemplary embodiments will be described herein in detail, examples of which are illustrated in the drawings. When the following description involves the drawings, like numerals in different drawings refer to like or similar elements unless otherwise indicated. Embodiments described in the following exemplary embodiments do not represent all embodiments consistent with the present disclosure. Rather, they are merely examples of apparatuses consistent with some aspects of the present disclosure as detailed in the appended claims.

The terminology used in the present disclosure is for the purpose of describing particular embodiments only, and is not intended to limit the present disclosure. Unless otherwise defined, technical or scientific terms used in the present disclosure should have ordinary meanings as understood by those ordinary skilled in the art to which the present disclosure belongs. Words "first", "second", and the like, as used in the specification and claims of the present disclosure, do not indicate any sequence, quantity or importance, but are only used to distinguish between different components. Likewise, words "a" or "an" and the like do not indicate any quantity limitation, but rather indicate the presence of at least one. Word "a plurality of" or "several" indicates two or more. Unless otherwise indicated, words such as "front", "rear", "lower" and/or "upper" are for illustrative purposes only, and are not limited to a position or a spatial orientation. Words "include" or "comprise" and the like are intended to refer to that an element or object appearing before "include" or "comprise" covers an element or object listed after "include" or "comprise" and its equivalents, and do not exclude other elements or objects. Words "connect" or "couple" and the like are not limited to a physical or mechanical connection, but may include an electrical connection, whether direct or indirect. As used in the specification and the appended claims of the present disclosure, terms determined by "a". "the" and "said" in their singular forms are intended to include plural forms as well, unless clearly indicated otherwise in the context. It should also be understood that the term "and/or" as used herein refers to and includes any or all possible combinations of one or more of the associated listed items.

In the related art, to improve a light transmittance of an area of a display substrate with an under display camera (UDC) corresponding to the UDC, only a light-emitting device is retained in this area, and a drive circuit for controlling the light-emitting device to emit light is provided outside a display area of the display substrate. In this case, the drive circuit provided outside the display area is electrically connected with the light-emitting device through a light-transmitting wire. When the UDC has a relatively large size, a plurality of light-transmitting wires arranged in layers may be required. Based on this, a method of preparing the display substrate includes: forming a drive circuit layer on a base substrate; forming an insulating material structure on the drive circuit layer, the insulating material structure being provided with a plurality of light-transmitting wires and a conductive connection structure electrically connected with the drive circuit layer therein, and the conductive connection structure being a Ti/Al/Ti laminated structure; forming a first electrode, a luminescent material layer, and a second electrode sequentially on a side of the insulating material structure facing away from the base substrate. The light-transmitting wires are electrically connected between the first electrode and the conductive connection structure. The plurality of light-transmitting wires provided in the insulating material structure are arranged in layers, resulting in a large thickness of the insulating material structure. To slope an edge of the insulating material structure, a step structure is often formed at the edge of the insulating material structure, which causes the conductive connection structure provided in the insulating material structure to be exposed. An etchant used in a process of forming the light-transmitting wires and the first electrode tends to corrode the exposed conductive connection structure, such that the Ti layer in the conductive connection structure is warped, resulting in an electrical connection between the Ti layer and the second electrode of the light-emitting layer. Moreover, since the conductive connection structure is electrically connected with the first electrode of the light-emitting layer, the first electrode and the second electrode of the light-emitting layer are short-circuited, resulting in circuit defects and also leading to burning in an aging process. The above-mentioned process of forming the light-transmitting wires and the first electrode may be a photolithography process, and the above-mentioned etchant may be a developer in the photolithography process, such as sulfuric acid.

Figure 2:
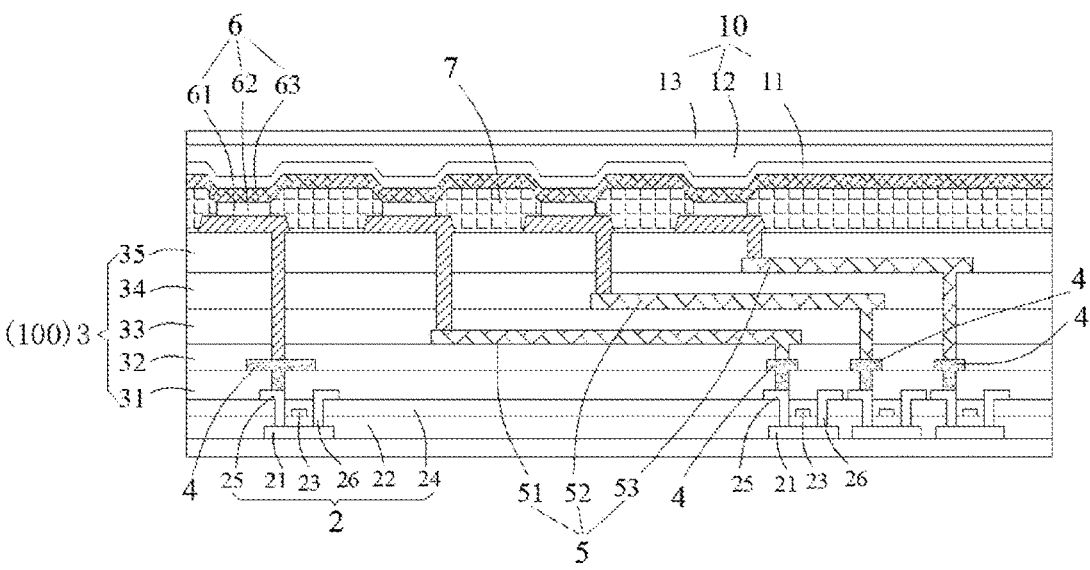
FIG. 2 is a schematic cross-sectional view illustrating a display substrate according to an embodiment of the present disclosure.
Figure 3:
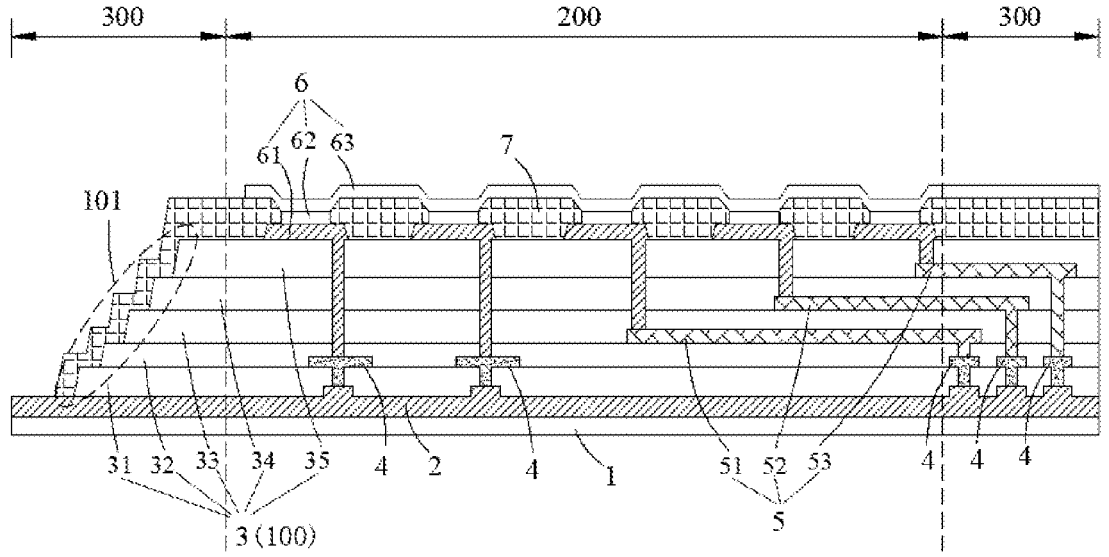
FIG. 3 is a partial schematic diagram illustrating a cross-sectional structure taken along line A-A shown in FIG. 1.

In view of this, embodiments of the present disclosure provide a display substrate. As shown in FIGS. 1-3, the display substrate may include a display area 200 and a frame area 300 surrounding the display area 200. The display substrate may include a base substrate 1, a drive circuit layer 2, an insulating material structure 100, a conductive connection structure 4, an encapsulation layer 10, a first barrier wall 8, and a light-emitting layer 6.

The drive circuit layer 2 is provided on the base substrate 1. The insulating material structure 100 is provided on a side of the drive circuit layer 2 facing away from the base substrate 1, and located in the display area 200 and at least a portion of the frame area 300. The insulating material structure 100 is provided with a step structure 101 at an edge thereof. The conductive connection structure 4 is provided inside the insulating material structure 100. The conductive connection structure 4 is electrically connected with the drive circuit layer 2. The light-emitting layer 6 is provided on a side of the insulating material structure 100 facing away from the drive circuit layer 2. The encapsulation layer 10 covers the light-emitting layer 6. The first barrier wall 8 is provided on the side of the drive circuit layer 2 facing away from the base substrate 1. The first barrier wall 8 may surround the insulating material structure 100. The first barrier wall 8 is configured to block a portion of the encapsulation layer 10. The edge of the insulating material structure 100 provided with the step structure 101 is an edge of the insulating material structure 100 close to the first barrier wall 8.

With a display substrate according to embodiments of the present disclosure, an insulating material structure 100 is provided with a step structure 101 at an edge thereof to provide a slope at the edge of the insulating material structure 100, which can reduce the risk of fracture of a subsequent film layer covering the edge of the insulating material structure 100. Meanwhile, since a conductive connection structure 4 is provided inside the insulating material structure 100, it is possible to prevent corrosion of the conductive connection structure 4 by an etchant used in a subsequent film layer forming process, and avoid warping of the conductive connection structure 4, which in turn can prevent the conductive connection structure 4 from being electrically connected with both electrodes of a light-emitting layer 6 to cause circuit defects as well as burning in an aging process.

Components of the display substrate according to embodiments of the present disclosure will be described in detail below.

As shown in FIGS. 2 and 3, the base substrate 1 may be a rigid substrate. The rigid substrate may include a glass substrate, a PMMA (polymethyl methacrylate) substrate, or the like. The base substrate 1 may also be a flexible substrate. The flexible substrate may include a PET (polyethylene terephthalate) substrate, a PEN (Polyethylene naphthalate two formic acid glycol ester) substrate, or a PI (polyimide) substrate.

As shown in FIGS. 2 and 3, the drive circuit layer 2 is disposed on the base substrate 1. The drive circuit layer 2 may include a plurality of drive transistors. The drive transistors may be thin-film transistors (TFTs), but embodiments of the present disclosure are not limited thereto. The TFT may be a top-gate TFT: however, the TFT may also be a bottom-gate TFT. For example, in the case that the TFT is a top-gate TFT, the drive circuit layer 2 may include an active layer 21, a gate insulation layer 22, a gate electrode 23, an interlayer insulation layer 24, a source electrode 25, and a drain electrode 26. The active layer 21 may be disposed on the base substrate 1. The gate insulation layer 22 may be disposed on the base substrate 1 and cover the active layer 21. The gate electrode 23 may be disposed on a side of the gate insulation layer 22 away from the base substrate 1. The interlayer insulation layer 24 may be disposed on the gate insulation layer 22 and cover the gate electrode 23. The source electrode 25 and the drain electrode 26 may be disposed on the interlayer insulation layer 24, and connected to the active layer 21 via vias passing through the interlayer insulation layer 24 and the gate insulation layer 22.

Figure 4:
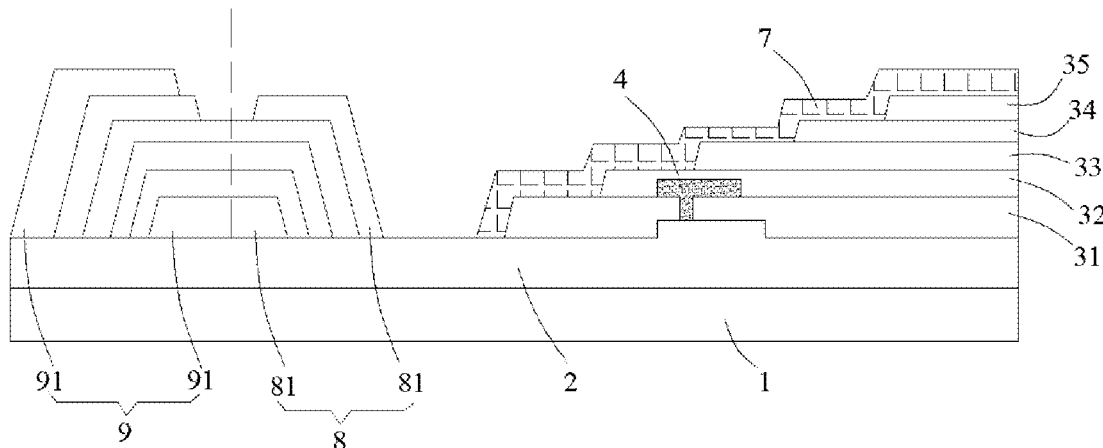
FIG. 4 is another partial schematic diagram illustrating a cross-sectional structure taken along line A-A shown in FIG. 1.

As shown in FIG. 2. FIG. 3 and FIG. 4, the insulating material structure 100 is disposed on the side of the drive circuit layer 2 facing away from the base substrate 1. The insulating material structure 100 may be disposed on a side of the above-described interlayer insulation layer 24 facing away from the base substrate 1, and cover the source electrode 25 and the drain electrode 26 of the TFT. The insulating material structure 100 may include a plurality of planarization layers 3 laminated on top of each other. The plurality of planarization layers 3 may have the same thickness, or may have different thicknesses. The plurality of planarization layers 3 may be made of the same material, or may be made of different material. In particular, the plurality of planarization layers 3 may include a first planarization layer 31, a second planarization layer 32, a third planarization layer 33, a fourth planarization layer 34, and a fifth planarization layer 35 that are laminated on top of each other. The first planarization layer 31 may be disposed on the side of the above-described interlayer insulation layer 24 facing away from the base substrate 1, and cover the source electrode 25 and the drain electrode 26 of the TFT. The first planarization layer 31, the second planarization layer 32, the third planarization layer 33, the fourth planarization layer 34, and the fifth planarization layer 35 are sequentially laminated in a direction away from the base substrate 1.

As shown in FIG. 3 and FIG. 4, the insulating material structure 100 is provided with the step structure 101 at the edge thereof to provide a slope at the edge of the insulating material structure 100, so as to avoid fracture of subsequent deposited film layers at the edge of the insulating material structure 100 when the insulating material structure 100 has a large thickness. For example, in the case that the insulating material structure 100 includes four sides connected in sequence, an edge of the insulating material structure 100 at one side may be provided with the step structure 101. For example, in the case that the insulating material structure 100 includes a plurality of planarization layers 3 arranged in a stack, the plurality of planarization layers 3 are staggered sequentially to form the step structure 101. The step structure 101 may have a step height that increases gradually in a direction from the edge of the insulating material structure 100 to the display area 200. The plurality of planarization layers 3 may have at least partially different staggered distances between any two adjacent ones thereof. For example, the staggered distance between the first planarization layer 31 and the second planarization layer 32 may be less than the staggered distance between the second planarization layer 32 and the third planarization layer 33, and the staggered distance between the second planarization layer 32 and the third planarization layer 33 may be equal to the staggered distance between the third planarization layer 33 and the fourth planarization layer 34.

As shown in FIG. 2. FIG. 3 and FIG. 4, the conductive connection structure 4 may have a film layer structure parallel to the base substrate 1. The conductive connection structure 4 may have a laminated structure of Ti/Al/Ti, for example. The conductive connection structure 4 may also have a single-layer structure which may be made of Mo, but embodiments of the present disclosure are not limited thereto. The conductive connection structure 4 is provided inside the insulating material structure 100, thus corrosion of the conductive connection structure 4 by a developer used in a subsequent photolithography process may be avoided. For example, in the case that the insulating material structure 100 includes a plurality of planarization layers 3, the conductive connection structure 4 may be wrapped between two adjacent planarization layers 3. Further, the conductive connection structure 4 may be wrapped between two adjacent planarization layers 3 closest to the base substrate 1. In particular, in the case that the plurality of planarization layers 3 include a first planarization layer 31, a second planarization layer 32, a third planarization layer 33, a fourth planarization layer 34, and a fifth planarization layer 35, which are sequentially laminated in a direction away from the base substrate 1, for example, the conductive connection structure 4 may be wrapped between the first planarization layer 31 and the second planarization layer 32. The conductive connection structure 4 is electrically connected with the drive circuit layer 2. In particular, the conductive connection structure 4 may be electrically connected with the source electrode 25 or the drain electrode 26 of the above-described TFT in the drive circuit layer 2. The conductive connection structure 4 may be electrically connected with the source electrode 25 or the drain electrode 26 of the TFT via a via passing through the first planarization layer 31.

As shown in FIG. 2 and FIG. 3, the light-emitting layer 6 is disposed on the side of the insulating material structure 100 facing away from the drive circuit layer 2. The light-emitting layer 6 may include a first electrode 61, a luminescent material layer 62, and a second electrode 63. The first electrode 61 may be an anode, and the second electrode 63 may be a cathode. The anode may be disposed on the side of the insulating material structure 100 facing away from the drive circuit layer 2, the cathode may be disposed on a side of the anode facing away from the insulating material structure 100, and the luminescent material layer 62 may be disposed between the anode and the cathode. For example, in the case that the insulating material structure 100 includes a plurality of planarization layers 3, the anode may be disposed on a side of the planarization layer 3 farthest from the base substrate 1 that faces away from the base substrate 1, that is, the anode may be disposed on a side of the fifth planarization layer 35 facing away from the base substrate 1. The light-emitting layer 6 may be electrically connected with the conductive connection structure 4. Since the conductive connection structure 4 is electrically connected with the drive circuit layer 2, the light-emitting layer 6 is electrically connected with the drive circuit layer 2, such that the drive circuit layer 2 may drive the light-emitting layer 6 to emit light. The anode of the light-emitting layer 6 may be electrically connected with the conductive connection structure 4. In addition, the light-emitting layer 6 may include red light-emitting units, green light-emitting units, and blue light-emitting units.

Figure 5:
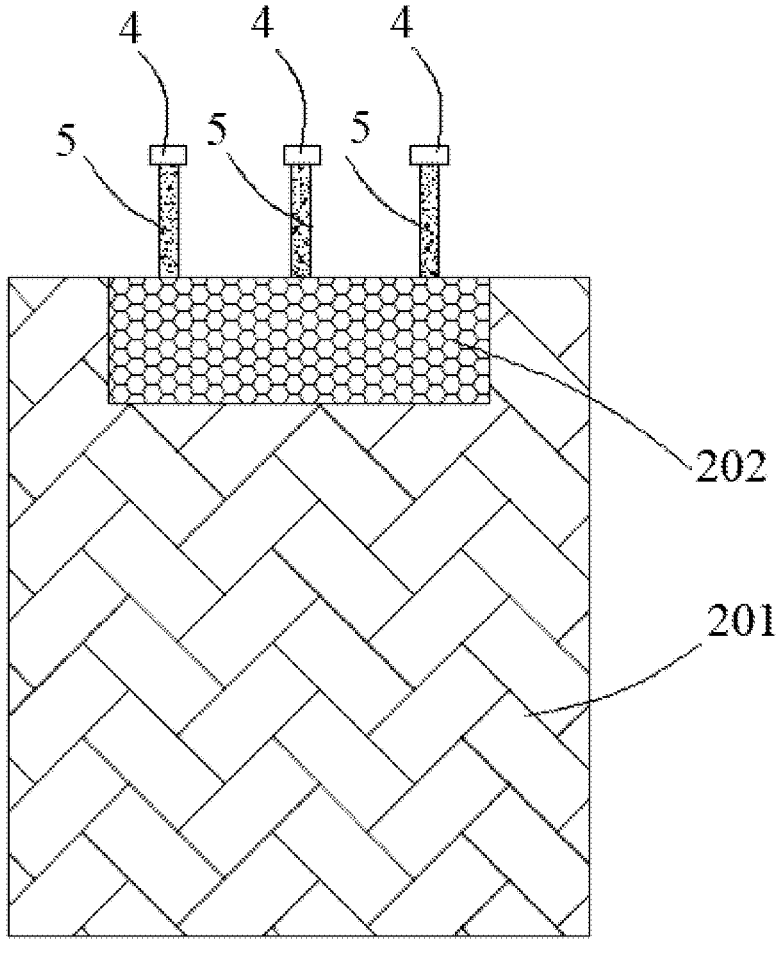
FIG. 5 is a schematic plan view illustrating a display substrate with light-transmitting wires according to an embodiment of the present disclosure.

As shown in FIG. 1. FIG. 2. FIG. 3, and FIG. 5, the display substrate according to embodiments of the present disclosure may further include one or more light-transmitting wires 5. For example, in the case that the insulating material structure 100 includes a plurality of planarization layers 3, the light-transmitting wires 5 may be provided between at least portions of adjacent two planarization layers 3 and be electrically connected with the light-emitting layer 6, such that the conductive connection structure 4 may be electrically connected with the light-emitting layer 6. The display area 200 may include a first display area 201 and a second display area 202. The light-emitting layer 6 may include at least one first light-emitting structure located in the first display area 201 and at least one second light-emitting structure located in the second display area 202. The drive circuit layer 2 may include a first drive circuit and a second drive circuit. At least a portion of the second drive circuit and at least a portion of the conductive connection structure 4 are located outside the second display area 202. For example, at least a portion of the second drive circuit and at least a portion of the conductive connection structure 4 are located in the frame area 300. The portion of the second drive circuit located outside the second display area 202 is electrically connected with the portion of the conductive connection structure 4 located outside the second display area 202. One end of the light-transmitting wire 5 is electrically connected with the portion of the conductive connection structure 4 located outside the second display area 202, and the other end of the light-transmitting wire 5 is electrically connected with the second light-emitting structure, such that the second light-emitting structure is electrically connected with the portion of the second drive circuit located outside the second display area 202. The display substrate according to the present disclosure may be further provided with a photosensitive device. The photosensitive device may be provided on a side of the base substrate 1 facing away from the light-emitting layer 6 and overlap with the second display area 202.

As shown in FIG. 3, the light-transmitting wire 5 may be made of indium tin oxide (ITO), but the present disclosure is not particularly limited thereto. The light-transmitting wire 5 may include a plurality of light-transmitting wires. For example, in the case that the plurality of planarization layers 3 include a first planarization layer 31, a second planarization layer 32, a third planarization layer 33, a fourth planarization layer 34, and a fifth planarization layer 35, which are laminated in sequence, and the conductive connection structure 4 is wrapped between the first planarization layer 31 and the second planarization layer 32, the light-transmitting wires 5 may include: a first light-transmitting wire 51 provided between the second planarization layer 32 and the third planarization layer 33: a second light-transmitting wire 52 provided between the third planarization layer 33 and the fourth planarization layer 34; and a third light-transmitting wire 53 provided between the fourth planarization layer 34 and the fifth planarization layer 35. In addition, the first light-transmitting wire 51, the second light-transmitting wire 52, and the third light-transmitting wire 53 are electrically connected with second light-emitting structures with sub-pixels of different colors, respectively. For example, the first light-transmitting wire 51 may be electrically connected with the second light-emitting structure with red sub-pixels, the second light-transmitting wire 52 may be electrically connected with the second light-emitting structure with green sub-pixels, and the third light-transmitting wire 53 may be electrically connected with the second light-emitting structure with blue sub-pixels. The light-transmitting wire 5 may be prepared through a photolithography process, and a developer used in the photolithography process may be nitric acid or the like.

As shown in FIG. 1 and FIG. 3, the frame area 300 has a bonding area 400. The bonding area 400 is located on a side of the insulating material structure 100 in a direction parallel to the base substrate 1. The step structure 101 may be disposed at the edge of the insulating material structure 100 close to the bonding area 400. The frame area 300 may be provided with a power signal line 14 in an area located between the bonding area 400 and the display area 200. The power signal line 14 may receive a VDD power signal. The power signal line 14 may include a first portion 141 extending substantially in a first direction and a second portion 142 extending substantially in a second direction. The first direction is an extension direction of a side edge of the display area 200 close to the bonding area 400. The second direction is substantially perpendicular to the first direction. The first direction 141 is electrically connected with the drive circuit layer 2, and a first end of the second portion 142 is connected with the first portion 141 and a second end of the second portion 142 extends to the bonding area 400. The conductive connection structure 4 includes the first portion 141 of the power signal line 14. An orthographic projection of an edge of the first portion 141 of the power signal line 14 close to the bonding area 400 side on the base substrate 1 is located within an orthographic projection of the step structure 101 on the base substrate 1. An orthographic projection of an edge of the first portion 141 of the power signal line 14 close to the bonding area 400 side on the base substrate 1 is located within an orthographic projection of the second planarization layer 32 on the base substrate 1. The source electrode 25 or the drain electrode 26 of the TFT electrically connected with the conductive connection structure 4 is connected in parallel with the conductive connection structure 4 to form the first portion 141 of the power signal line 14.

As shown in FIG. 2, the encapsulation layer 10 may include: a first inorganic layer 11; an organic layer 12 disposed on a side of the first inorganic layer 11 away from the base substrate 1; and a second inorganic layer 13 disposed on a side of the organic layer 12 away from the base substrate 1. The first barrier wall 8 may be disposed on a side of the above-described interlayer insulation layer 24 facing away from the base substrate 1. The first inorganic layer 11 may cover the first barrier wall 8 to form a better encapsulation. The organic layer 12 may be located within a range defined by the first barrier wall 8. That is, an orthographic projection of the organic layer 12 on the base substrate 1 is located within an orthographic projection of the first barrier wall 8 on the base substrate 1. In this way, the first barrier wall 8 can block the organic layer 12 in the encapsulation layer 10 to ensure a good encapsulation effect.

As shown in FIG. 1. FIG. 3 and FIG. 4, the first barrier wall 8 may include a plurality of first barrier layers 81 laminated on top of each other. A part of the plurality of first barrier layers 81 may be arranged in the same layers as a part of the plurality of planarization layers 3, respectively. For example, in the case that the plurality of planarization layers 3 include a first planarization layer 31, a second planarization layer 32, a third planarization layer 33, a fourth planarization layer 34, and a fifth planarization layer 35, which are laminated in sequence, the first barrier wall 8 may include five first barrier layers 81 arranged in a stack, and four of the five first barrier layers 81 close to the base substrate 1 may be arranged in the same layers as the first to fourth planarization layers, respectively.

As shown in FIGS. 2, 3 and 4, the display substrate according to the present disclosure may further include a pixel definition layer 7. The pixel definition layer 7 may be provided on the side of the insulating material structure 100 facing away from the drive circuit layer 2. The pixel definition layer 7 may be provided with a plurality of openings, and the light-emitting layer 6 may be disposed in the openings of the pixel definition layer 7. The pixel definition layer 7 may cover the step structure 101. The present disclosure allows for an increase in a thickness of the pixel definition layer 7 compared to a conventional pixel definition layer. The encapsulation layer 10 described above covers the pixel definition layer 7. For example, in the case that the first barrier wall 8 may include five first barrier layers 81 arranged in a stack, one of the five first barrier layers 81 farthest from the base substrate 1 may be arranged in the same layer as the pixel definition layer 7.

As shown in FIGS. 1 and 4, the display substrate according to the present disclosure may further include a second barrier wall 9. The second barrier wall 9 may be disposed on the side of the drive circuit layer 2 facing away from the base substrate 1. In particular, the second barrier wall 9 may be disposed on the side of the above-described interlayer insulation layer 24 facing away from the base substrate 1. The second barrier wall 9 surrounds the first barrier wall 8. The second barrier wall 9 may include a plurality of second barrier layers 91 laminated on top of each other. A part of the plurality of second barrier layers 91 may be arranged in the same layers as a part of the plurality of first barrier layers 81, respectively. Further, at least a part of the plurality of first barrier layers 81 of the first barrier wall 8 may be structurally integrated with at least a part of the plurality of second barrier layers 91 of the second barrier wall 9. For example, in the case that the first barrier wall 8 includes five first barrier layers 81, the second barrier wall 9 may include six second barrier layers 91, four second barrier layers 91 of the second barrier wall 9 close to the base substrate 1 may be arranged in the same layers as four first barrier layers 81 of the first barrier wall 8 close to the base substrate 1, respectively, and the four second barrier layers 91 of the second barrier wall 9 close to the base substrate 1 may be structurally integrated with the four first barrier layers 81 of the first barrier wall 8 close to the base substrate 1, one of the six second barrier layers 91 farthest from the base substrate 1 may be arranged in the same layer as the pixel definition layer 7, and the remaining one of the six second barrier layers 91 may be arranged in the same layer as the fifth planarization layer 35.

It should be noted that the above-mentioned "the same layer(s)" refers to a layer structure formed by using the same film forming process to form a film layer in which specific patterns are to be formed, and then using the same mask to perform a single patterning process on the formed film layer. Depending on the specific patterns, the single patterning process may include multiple exposure, development or etching processes. The specific patterns in the formed layer structure may be continuous or discontinuous, and these specific patterns may also be at different heights or have different thicknesses.

The display substrate according to embodiments of the present disclosure may further include a touch structure and a touch chip. The touch structure may be disposed on the above-described encapsulation layer 10. In particular, the touch structure may be disposed on the above-described second inorganic layer 13. The touch structure may be located in the display area 200 of the display substrate. The touch chip may be disposed in the above-described bonding area 400 and located on the same side of the base substrate 1 as the touch structure. The present disclosure may further include a signal transmission line connecting the touch structure and the touch chip, such that the touch chip may transmit a touch drive signal to the touch structure, or receive a touch sensing signal from the touch structure. The signal transmission line may be disposed on the encapsulation layer 10. One end of the signal transmission line extends into the display area 200 and is electrically connected with the touch structure, and the other end extends into the bonding area 400 and is electrically connected with the touch chip. Since the insulating material structure 100 is provided with the step structure 101 at an edge thereof close to a side of the bonding area 400, the edge of the insulating material structure 100 has a slope, such that the pixel definition layer 7 covering the step structure 101 has a slope, and in turn the encapsulation layer 10 covering the pixel definition layer 7 has a slope, which can avoid fracture of the signal transmission line disposed on the encapsulation layer 10.

Embodiments of the present disclosure further provide a display apparatus. The display apparatus may include the display substrate according to any one of the above embodiments. The display apparatus may include a mobile phone, a computer, a television, a camera, a wearable display, a navigator, a vehicle-mounted display, and the like, but embodiments of the present disclosure are not particularly limited thereto. In addition, the display apparatus may further include a photosensitive device. The photosensitive device may be provided on a side of the base substrate 1 facing away from the drive circuit layer 2 and overlap with the above-described second display area 202. Since the display substrate in the display apparatus according to embodiments of the present disclosure is the same as the display substrate in the above embodiments of the display substrate, the display substrate in the display apparatus according to embodiments of the present disclosure has the same beneficial effects as the display substrate in the above embodiments of the display substrate, which will not be repeated herein.

Embodiments of the present disclosure further provide a method of preparing a display substrate, which is used for preparing the display substrate according to any one of the above embodiments. The display substrate includes a display area and a frame area surrounding the display area. The method of preparing the display substrate may include steps S100-S150.

At step S100, a base substrate is provided.

At step S110, a drive circuit layer is formed on the base substrate.

At step S120, an insulating material structure and a conductive connection structure are formed on a side of the drive circuit layer facing away from the base substrate. The insulating material structure is provided with a step structure at an edge thereof, and located in the display area and at least a portion of the frame area. The conductive connection structure is provided inside the insulating material structure and electrically connected with the drive circuit layer.

At step S130, a light-emitting layer is formed on a side of the insulating material structure facing away from the drive circuit layer.

At step S140, an encapsulation layer is formed to cover the light-emitting layer.

At step S150, a first barrier wall is formed on the side of the drive circuit layer facing away from the base substrate. The first barrier wall surrounds the insulating material structure, and is configured to block a portion of the encapsulation layer, where the edge of the insulating material structure provided with the step structure is an edge of the insulating material structure close to the first barrier wall.

The insulating material structure may include a plurality of planarization layers laminated on top of each other, and forming the insulating material structure and the conductive connection structure on the side of the drive circuit layer facing away from the base substrate, may include: forming a first planarization layer on the side of the drive circuit layer facing away from the base substrate; forming the conductive connection structure on a side of the first planarization layer facing away from the base substrate; and forming the rest of the plurality of planarization layers on the side of the first planarization layer facing away from the base substrate. The conductive connection structure is wrapped between the first planarization layer and the planarization layer adjacent to the first planarization layer. The plurality of planarization layers are staggered sequentially to form the step structure. The step structure has a step height that gradually increases in a direction from the edge of the insulating material structure to the display area.

The method of preparing the display substrate and the display substrate according to embodiments of the present disclosure belong to the same inventive concept, and the description of relevant details and beneficial effects may be referred to each other and will not be repeated.

The foregoing are merely preferred embodiments of the present disclosure, and do not limit the present disclosure in any form. Although the present disclosure has been disclosed as above in the preferred embodiments, the present disclosure is not limited thereto. Any person skilled in the art may utilize the technical contents disclosed above to make some variations or modifications into equivalent embodiments with equivalent changes, without departing from the scope of the technical solution of the present disclosure. Any simple variations, equivalent changes and modifications made to the above embodiments based on the technical essence of the present disclosure without departing from the contents of the technical solution of the present disclosure shall fall within the scope of the technical solution of the present disclosure.

The invention claimed is:

1. A display substrate comprising a display area and a frame area surrounding the display area, the display substrate comprising:

a base substrate;

a drive circuit layer provided on the base substrate;

an insulating material structure provided on a side of the drive circuit layer facing away from the base substrate, located in the display area and at least a portion of the frame area, and provided with a step structure at an edge thereof;

a light-emitting layer provided on a side of the insulating material structure facing away from the drive circuit layer;

an encapsulation layer covering the light-emitting layer;

a first barrier wall provided on the side of the drive circuit layer facing away from the base substrate, surrounding the insulating material structure, and configured to block a portion of the encapsulation layer, wherein the edge of the insulating material structure provided with the step structure is an edge of the insulating material structure close to the first barrier wall;

a conductive connection structure provided inside the insulating material structure and electrically connected with the drive circuit layer; and one or more light-transmitting wires, comprising one portion provided in the display area and the other portion provided in the frame area, and configured to transmit light, electrically connect at least a portion of the conductive connection structure with the light-emitting layer, and electrically connect the light-emitting layer with the drive circuit layer, wherein the display area comprises a first display area and a second display area, the second display area being an area corresponding to a photosensitive device, and the first display area being an area in the display area other than the second display area;

the light-emitting layer comprises at least one first light-emitting structure located in the first display area and at least one second light-emitting structure located in the second display area;

at least a portion of the drive circuit layer and at least a portion of the conductive connection structure are located in the frame area, and the portion of the drive circuit layer located in the frame area is electrically connected with the portion of the conductive connection structure located in the frame area; and for each of the one or more light-transmitting wires, one end of the light-transmitting wire is electrically connected with the portion of the conductive connection structure located in the frame area, and the other end of the light-transmitting wire is electrically connected with the second light-emitting structure.

2. The display substrate of claim 1, wherein the insulating material structure comprises a plurality of planarization layers laminated on top of each other, and the conductive connection structure is wrapped between adjacent two of the planarization layers; and the plurality of planarization layers are staggered sequentially to form the step structure, and the step structure has a step height that gradually increases in a direction from the edge of the insulating material structure to the display area.

3. The display substrate of claim 2, wherein the one or more light-transmitting wires are provided between at least portions of adjacent two of the planarization layers.

4. The display substrate of claim 3, wherein the plurality of planarization layers comprise a first planarization layer, a second planarization layer, a third planarization layer, a fourth planarization layer, and a fifth planarization layer that are laminated sequentially in a direction away from the base substrate; and the conductive connection structure is wrapped between the first planarization layer and the second planarization layer; and the light-transmitting wires comprise: a first light-transmitting wire disposed between the second planarization layer and the third planarization layer; a second light-transmitting wire disposed between the third planarization layer and the fourth planarization layer; and a third light-transmitting wire disposed between the fourth planarization layer and the fifth planarization layer, and the first light-transmitting wire, the second light-transmitting wire, and the third light-transmitting wire are electrically connected with second light-emitting structures with sub-pixels of different colors, respectively.

5. The display substrate of claim 4, wherein the frame area comprises a bonding area located on a side of the insulating material structure in a direction parallel to the base substrate;

the step structure is disposed at the edge of the insulating material structure close to the bonding area;

the frame area is provided with a power signal line in an area located between the bonding area and the display area, and the power signal line comprises a first portion extending substantially in a first direction and a second portion extending substantially in a second direction, wherein the first direction is an extension direction of a side edge of the display area close to the bonding area, and the second direction is substantially perpendicular to the first direction;

the first portion is electrically connected with the drive circuit layer, and a first end of the second portion is connected with the first portion; and the conductive connection structure comprises the first portion.

6. The display substrate of claim 5, wherein an orthographic projection of an edge of the first portion of the power signal line close to the bonding area on the base substrate is located within an orthographic projection of the step structure on the base substrate.

7. The display substrate of claim 5, wherein an orthographic projection of an edge of the first portion of the power signal line close to the bonding area on the base substrate is located within an orthographic projection of the second planarization layer on the base substrate.

8. The display substrate of claim 2, wherein the first barrier wall comprises a plurality of first barrier layers laminated on top of each other, and a part of the plurality of first barrier layers are arranged in same layers as a part of the plurality of planarization layers, respectively.

9. The display substrate of claim 8, further comprising:

a pixel definition layer provided on the side of the insulating material structure facing away from the drive circuit layer, and the encapsulation layer covering the pixel definition layer, wherein one of the plurality of first barrier layers farthest from the base substrate is arranged in a same layer as the pixel definition layer.

10. The display substrate of claim 8, further comprising:

a second barrier wall provided on the side of the drive circuit layer facing away from the base substrate, and surrounding the first barrier wall, wherein the second barrier wall comprises a plurality of second barrier layers laminated on top of each other, and a part of the plurality of second barrier layers are arranged in same layers as a part of the plurality of first barrier layers, respectively.

11. The display substrate of claim 10, wherein at least a part of the plurality of first barrier layers of the first barrier wall are structurally integrated with at least a part of the plurality of second barrier layers of the second barrier wall.

12. The display substrate of claim 1, further comprising:

a pixel definition layer provided on the side of the insulating material structure facing away from the drive circuit layer, and covering the step structure.

13. The display substrate of claim 2, wherein the plurality of planarization layers have at least partially different staggered distances between two adjacent ones thereof.

14. A display apparatus, comprising a display substrate comprising a display area and a frame area surrounding the display area, wherein the display substrate further comprises:

a base substrate;

a drive circuit layer provided on the base substrate;

an insulating material structure provided on a side of the drive circuit layer facing away from the base substrate, located in the display area and at least a portion of the frame area, and provided with a step structure at an edge thereof;

a light-emitting layer provided on a side of the insulating material structure facing away from the drive circuit layer;

an encapsulation layer covering the light-emitting layer;

a first barrier wall provided on the side of the drive circuit layer facing away from the base substrate, surrounding the insulating material structure, and configured to block a portion of the encapsulation layer, wherein the edge of the insulating material structure provided with the step structure is an edge of the insulating material structure close to the first barrier wall;

a conductive connection structure provided inside the insulating material structure and electrically connected with the drive circuit layer; and one or more light-transmitting wires, comprising one portion provided in the display area and the other portion provided in the frame area, and configured to transmit light, electrically connect at least a portion of the conductive connection structure with the light-emitting layer, and electrically connect the light-emitting layer with the drive circuit layer, wherein the display area comprises a first display area and a second display area, the second display area being an area corresponding to a photosensitive device, and the first display area being an area in the display area other than the second display area;

the light-emitting layer comprises at least one first light-emitting structure located in the first display area and at least one second light-emitting structure located in the second display area;

at least a portion of the drive circuit layer and at least a portion of the conductive connection structure are located in the frame area, and the portion of the drive circuit layer located in the frame area is electrically connected with the portion of the conductive connection structure located in the frame area; and for each of the one or more light-transmitting wires, one end of the light-transmitting wire is electrically connected with the portion of the conductive connection structure located in the frame area, and the other end of the light-transmitting wire is electrically connected with the second light-emitting structure.

15. A display apparatus, comprising:

the display substrate of claim 3; and the photosensitive device provided on a side of the base substrate facing away from the drive circuit layer.

16. A method of preparing a display substrate comprising a display area and a frame area surrounding the display area, the method comprising:

providing a base substrate;

forming a drive circuit layer on the base substrate;

forming an insulating material structure and a conductive connection structure on a side of the drive circuit layer facing away from the base substrate, the insulating material structure being provided with a step structure at an edge thereof, and located in the display area and at least a portion of the frame area, and the conductive connection structure being provided inside the insulating material structure and electrically connected with the drive circuit layer;

forming a light-emitting layer on a side of the insulating material structure facing away from the drive circuit layer;

forming an encapsulation layer to cover the light-emitting layer; and forming a first barrier wall on the side of the drive circuit layer facing away from the base substrate, the first barrier wall surrounding the insulating material structure, and being configured to block a portion of the encapsulation layer, wherein the edge of the insulating material structure provided with the step structure is an edge of the insulating material structure close to the first barrier wall, wherein the method further comprises;

forming one or more light-transmitting wires within the insulating material structure, such that the one or more light-transmitting wires comprise one portion provided in the display area and the other portion provided in the frame area, and are configured to transmit light, electrically connect at least a portion of the conductive connection structure with the light-emitting layer, and electrically connect the light-emitting layer with the drive circuit layer, wherein the display area comprises a first display area and a second display area, the second display area being an area corresponding to a photosensitive device, and the first display area being an area in the display area other than the second display area;

the light-emitting layer comprises at least one first light-emitting structure located in the first display area and at least one second light-emitting structure located in the second display area;

at least a portion of the drive circuit layer and at least a portion of the conductive connection structure are located in the frame area, and the portion of the drive circuit layer located in the frame area is electrically connected with the portion of the conductive connection structure located in the frame area; and for each of the one or more light-transmitting wires, one end of the light-transmitting wire is electrically connected with the portion of the conductive connection structure located in the frame area, and the other end of the light-transmitting wire is electrically connected with the second light-emitting structure.

17. The method of claim 16, wherein the insulating material structure comprises a plurality of planarization layers laminated on top of each other, and forming the insulating material structure and the conductive connection structure on the side of the drive circuit layer facing away from the base substrate, comprises:

forming a first planarization layer on the side of the drive circuit layer facing away from the base substrate;

forming the conductive connection structure on a side of the first planarization layer facing away from the base substrate; and forming the rest of the plurality of planarization layers on the side of the first planarization layer facing away from the base substrate, wherein the conductive connection structure is wrapped between the first planarization layer and the planarization layer adjacent to the first planarization layer, the plurality of planarization layers are staggered sequentially to form the step structure, and the step structure has a step height that gradually increases in a direction from the edge of the insulating material structure to the display area.

18. The display apparatus of claim 14, wherein the insulating material structure comprises a plurality of planarization layers laminated on top of each other, and the conductive connection structure is wrapped between adjacent two of the planarization layers; and the plurality of planarization layers are staggered sequentially to form the step structure, and the step structure has a step height that gradually increases in a direction from the edge of the insulating material structure to the display area.

19. The display apparatus of claim 14, wherein the frame area comprises a bonding area located on a side of the insulating material structure in a direction parallel to the base substrate;

the step structure is disposed at the edge of the insulating material structure close to the bonding area;

the frame area is provided with a power signal line in an area located between the bonding area and the display area, and the power signal line comprises a first portion extending substantially in a first direction and a second portion extending substantially in a second direction, wherein the first direction is an extension direction of a side edge of the display area close to the bonding area, and the second direction is substantially perpendicular to the first direction;

the first portion is electrically connected with the drive circuit layer, and a first end of the second portion is connected with the first portion; and the conductive connection structure comprises the first portion.

* * * * *